US008845843B2

(12) United States Patent
Savoyet et al.

(10) Patent No.: US 8,845,843 B2
(45) Date of Patent: Sep. 30, 2014

(54) METHODS AND MEANS FOR CONSTITUTING GRAPHICAL DATA, AND FOR PROTECTING USE OF SUCH DATA, AND MODES OF READING AND STORING SUCH DATA

(76) Inventors: Jean Louis Savoyet, La Motte d'Aveillans (FR); Julien Savoyet, Fontaine (FR); Remy Savoyet, La Motte d'Aveillans (FR)

( * ) Notice: Subject to any disclaimer, the term of this patent is extended or adjusted under 35 U.S.C. 154(b) by 622 days.

(21) Appl. No.: 12/360,450

(22) Filed: Jan. 27, 2009

(65) Prior Publication Data

US 2009/0188611 A1 Jul. 30, 2009

(30) Foreign Application Priority Data

Jan. 29, 2008 (FR) ...................................... 08 00456

(51) Int. Cl.
*G03F 7/00* (2006.01)

(52) U.S. Cl.
USPC ............................. 156/272.8; 216/28; 430/13

(58) Field of Classification Search
USPC ........ 156/272.8; 216/28, 54; 430/13; 359/22, 359/32, 33
See application file for complete search history.

(56) References Cited

U.S. PATENT DOCUMENTS 3,667,983 A 6/1972 Haggas et al.
4,359,519 A 11/1982 Kraus et al.
4,564,932 A * 1/1986 Lange .......................... 369/286
4,725,511 A * 2/1988 Reber .......................... 428/620
5,564,932 A 10/1996 Castleman
5,972,233 A * 10/1999 Becker et al. .................. 216/28
6,127,049 A * 10/2000 Zhou et al. .................... 428/641
6,264,321 B1 7/2001 Bugner et al.
6,409,014 B1 6/2002 Hummell et al.
6,468,637 B1 10/2002 Kwasny et al.
6,576,863 B1 * 6/2003 Piltch et al. .............. 219/121.64
7,173,744 B1 * 2/2007 Whiteside et al. ................ 359/3

(Continued)

FOREIGN PATENT DOCUMENTS

DE 3632622 A1 4/1987
EP 1 193 049 4/2002

(Continued)

OTHER PUBLICATIONS

P.R. Krauss, S.Y. Chou, "Nano-compact disks with 400 Gbit/in2 storage density fabricated using nanoimprint lithography and read with proximal probe", Appl. Phys. Lett. 71(21), Nov. 24, 1997, 3174-3176.*

(Continued)

*Primary Examiner* — Christina Johnson
*Assistant Examiner* — Elizabeth Royston
(74) *Attorney, Agent, or Firm* — Rothwell, Figg, Ernst & Manbeck, P.C.

(57) ABSTRACT

A method of making a data carrier medium comprising a first carrier layer and a graphical inscription on said first carrier layer and constituted, for example, by a text, by a photograph, or by digital data. The method comprises the steps consisting in performing the graphical inscription by depositing at least one metal lithographic deposition of metal on the first carrier layer, in supplying the first carrier layer made of a transparent material, and further in placing a second carrier layer made of a transparent material in superposition on the first carrier layer so as to protect the graphical inscription.

10 Claims, 1 Drawing Sheet

(56) References Cited

U.S. PATENT DOCUMENTS

| | | | | |
|---|---|---|---|---|
| 7,352,686 | B2 * | 4/2008 | Thompson et al. | 369/284 |
| 7,465,530 | B1 * | 12/2008 | Chen et al. | 430/270.1 |
| 7,649,661 | B2 * | 1/2010 | Chuang et al. | 359/22 |
| 2005/0046817 | A1 | 3/2005 | Wolfe et al. | |
| 2005/0160445 | A1 * | 7/2005 | Ohgi | 720/738 |

FOREIGN PATENT DOCUMENTS

| | | | |
|---|---|---|---|
| EP | 1 793 273 | | 6/2007 |
| FR | 2 448 167 | | 12/1997 |
| FR | 2 851 496 | A1 | 8/2004 |
| JP | 2005-343023 | | 12/2005 |
| WO | WO 99/33760 | | 7/1999 |
| WO | WO 99/55188 | A1 | 11/1999 |

OTHER PUBLICATIONS

Definition of Relief (http://dictionary.reference.com/browse/relief).*

Definition of Relief (http://dictionary.reference.com/browse/relief) Mar. 9, 2011.*

French Search Report issued in FR 0800456 on Jan. 9, 2009, 2 pages.

Seigneur et al. "Laser Soldering of LTCC Hermetic Packages with Minimal Thermal Impact," Ecole Polytechnique Fédérale de Lausanne, STI, IPR, LPM, 1015 Lausanne, Switzerland, pp. 526-530 (5 pages), Jun. 2007.

Stoppel et al. "A Survey of Electronic Techniques for Pictorial Image Reproduction" IEEE Transactions on Communications, vol. Com-29, No. 12, Dec. 1981, pp. 1898-1925 (28 pages).

* cited by examiner

METHODS AND MEANS FOR CONSTITUTING GRAPHICAL DATA, AND FOR PROTECTING USE OF SUCH DATA, AND MODES OF READING AND STORING SUCH DATA

BACKGROUND OF THE INVENTION

1. Field of the Invention

The present invention relates to a method and means for durably preserving graphical data transferred onto a transparent material.

2. Discussion of the Background Art

Equipment has appeared recently that lies within the meaning of the term “compact disc” and on which data is inscribed using a process that is binary and known to the person skilled in the art as characterizing the basic concept of computer science.

The physical expression is constituted by a succession of depressions and of projections, represented by 1s and 0s in computer language, or commonly by the terms “on” and “off”.

All such known devices as briefly described above suffer from the same prohibitive phenomenon when attempting to satisfy a requirement for extreme durability, namely they are made of materials of the polymer type or having similar characteristics, such materials being of low hardness, and easily pressable, where pressing is the very basis of the process used to obtain them, i.e. to duplicate them, as implemented in mass production on the basis of a master made of metal or of hard materials.

Devices are known on which information is embodied by a succession of depressions or projections or studs, or by a succession of lines, e.g.: bar codes, that are interpreted and read by means of a coherent light beam, such as a light beam formed by a laser.

All devices for carrying information contained in this way require frequent refreshing after a variable length of time, which length of time is measured in centuries in the context of the present invention, and they can even require new copies to be made.

Another known method that is proposed by its inventors as satisfying the dual objective of miniaturization and of data preservation is described by the Los Alamos National Laboratory (New Mexico 87545) Analysis of the claims attached to that description reveals firstly a high cost given the materials used, and secondly relative sensitivity to various attacks, in particular of physico-chemical origin as stated by the inventors of the method in question.

SUMMARY OF THE INVENTION

The present invention as claimed proposes a satisfactory response to each of the disadvantages suffered by known devices.

In addition, the invention described proposes a method and a response that often reduces the amount of space used up by etching, regardless of whether said etching is in the form of depressions and projections, or of other symbols of the digital or graphical types, relative to the volume of information contained on a given surface area of information carrier medium.

The invention as claimed consists in describing and implementing solutions procuring extreme durability as regards both the information medium and the physical existence of the information.

Other objects and advantages of the invention will become apparent to those of skill in the art upon review of the detailed description of the invention provided herein.

DETAILED DESCRIPTION OF THE PREFERRED EMBODIMENTS

Figure 1:
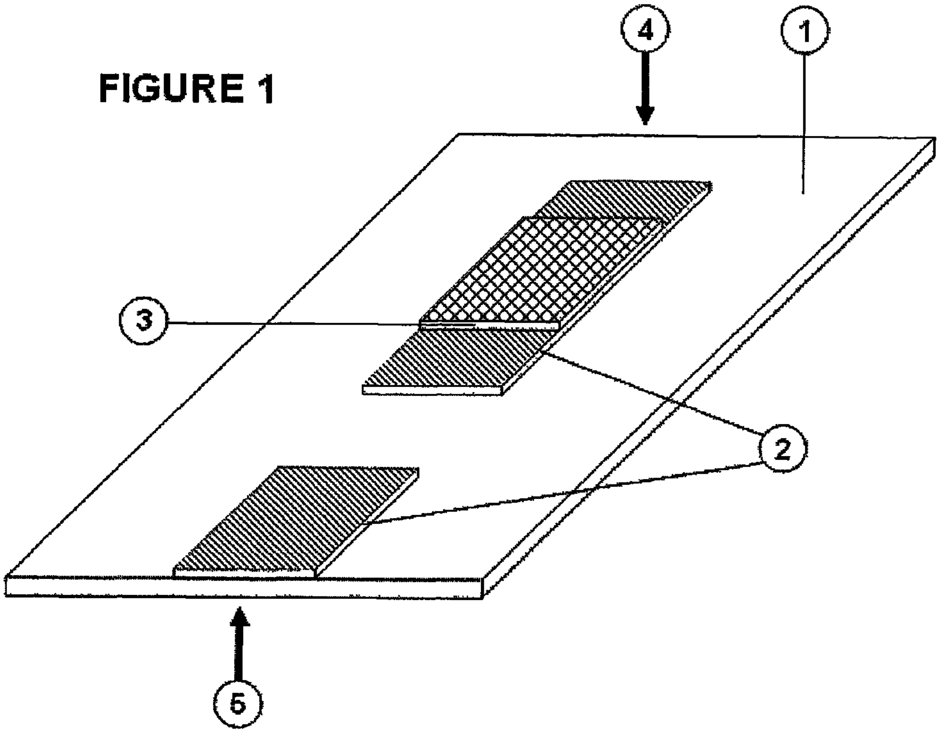
FIGS. 1 and 2 are perspective views illustrating a method of making a data carrier medium according to an embodiment of the present invention.
Figure 2:
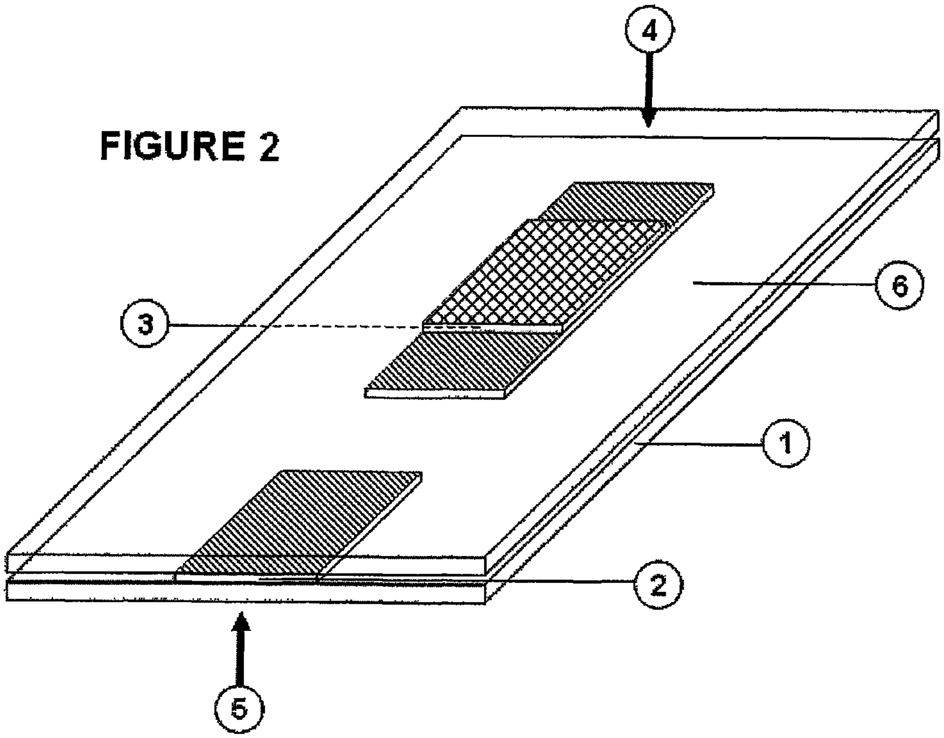

Referring now to FIGS. 1 and 2, the present invention relates to a method of durably preserving graphical data expressed in the form of a graphic or trace 2 and 3 transferred onto a transparent material or medium 1, this graphic being mechanically protected in a manner that is characteristic of the invention by superposing a material or medium 6 on said graphic, which material is preferably of the same type as the material constituting the medium carrying said graphic, and, in any event, both materials have high light transmission coefficients, and mechanical characteristics that are sufficient in view of the objective of durable preservation of the resulting article. The invention as claimed also relates to a set of devices and methods enabling and facilitating easy viewing of said graphic in the form of a trace 2 and 3 that can be an exact reproduction of an original, such as a text or a photograph, or digital data, which reproduction is extremely miniaturized, and said invention as claimed also relates to interpreting and reading the data in accordance with one of the characteristics of the invention. The invention also considers descriptions relating to preferred uses and to implementation thereof.

As regards the medium: in accordance with the invention, a material is used that presents the following characteristics:

light-permeability, extreme hardness in withstanding mechanical attack, and resistance to attack from chemicals, heat, radiation, and wind.

All of these characteristics are presented, in particular, by sapphire, but it is to be understood that implementation of some other material presenting the characteristics described would not be innovative relative to the present invention.

Data inscribed using the present invention as claimed is preferably inscribed in the form of a deposit of metal on sapphire using, by way of example, a technique known by the person skilled in the art as “lithography”, as used, in particular, in the semiconductor industry, metal being deposited continuously or in discontinuous manner in accordance with the present invention with a view to constituting markers identifiable by the associated read means of the coherent light emitter/receiver type on analyzing the received signal, preferably while taking account of the differences in light permeability created by the presence of said deposit of metal.

The following metals are preferably deposited in accordance with the present invention:

platinum, gold, and metal oxides, all of which present relative incorruptibility, deposited in accordance with the invention, including by partially stacking up layers with a view, in particular, to constituting zones that are interpretable in the computer science sense, that are read via an appropriate optical read device that is known to the person skilled in the art, or, when it is a text or a photograph, that is directly interpretable by the human eye, optionally subject to use of a magnifying device, depending on the miniaturization ratio implemented.

In the meaning of the present invention, the term "interpretable by the human eye" is to be understood as being suitable for being reproduced by a publishing system of the camera-and-printer type.

It can be understood as lying within the invention that digital data can be implemented that embodies a sound recording consisting in a succession of deposits of metal constituting perceptible light permeability levels.

The invention as claimed thus also consists in composing the elements that constitute the optionally digital graphical data indicated above, and in preferred modes of reading and of interpreting said data.

Whereas the above-described devices have in common a database enabling the data to be used by known interpretation or read means, preserving data that is directly interpretable by the human eye in the meaning of the present invention usually consists in inscribing the data (be it painting or writing) directly on various media, the most well known of which, through its ease of use, is paper.

The technique of photography offers merely the possibility of faithfully transcribing an original image embodied on a paper medium carrying the photograph. That technique does not include any means of procuring increased durability. The use of protective glass of the framed painting type usually constitutes no more than providing mechanical protection for said photographs.

As regards the technique of photography, it is known that glass plates are used as backing for carrying light-sensitive materials, glass being used as backing due to its light transparency, with that solution being characteristic of the invention of photography.

As described, the present invention consists in embodying a trace that is either digital or in the form of a text or of a photograph by depositing metal using the lithographic technique which is itself known in various variants, one of which is used in making electronic printed circuits, the visual perception made possible by the present invention being achieved, when considering a photograph, by gray-scale levels obtained by rasterization, and another characteristic of the invention as claimed being constituted by variable levels of density of black dots or of white dots, together embodying the transferred graphic, and imparting its visually perceptible relief thereto.

In accordance with the present invention, partial superposition of deposits of metal of mutually identical composition or of mutually distinct compositions leads to optical opacity that can be interpreted by simple means that are known and that are used to assist implementation of the invention.

It is claimed as regards inventive step that the metal deposit can be of very small thickness, to the extent of being relatively permeable to light, or indeed very permeable. By way of example, mention might be made of a deposit of a layer of aluminum on each of the lenses of binoculars. In which case, the fact that the deposition is preferably performed by cathode sputtering does not detract in any way from its use as an example to indicate that a fine layer of metal placed on a transparent surface does not degrade its permeability to light, at least not in a manner that disrupts human visual perception, even though such a layer is detectable by optical devices that are made all the easier to use when the opacity is high, regardless of whether that opacity results from the application of any of the optical variables introduced in accordance with the invention, or from the superposition of a plurality of identical metal layers in accordance with the invention, regardless of whether or not those layers are made of the same metal, platinum preferably being used as the first or sole layer deposited, depending on circumstances. However, the use of other materials in the meaning of the present invention would not constitute novelty in terms of new inventive step.

In accordance with the present invention, regarding, in particular, the positioning of the etched carrier medium with a view to it being read by interpreting the metal deposit formed as claimed above, the positioning of a light source is indicated (FIG. 1, reference 4) when such a light source is used to assist reading or viewing, and the direction of viewing for interpretation purposes is indicated (FIG. 1, reference 5).

It should be noted as characterizing the invention that the viewing described when it is in the form of looking with the human eye involves having a read direction that remains unchanged, as is characteristic of the invention, after depositing one or more layers of metal in accordance with the present invention. For reading or interpreting purposes, the analyzed looked-at visible face of the etching carrier medium is that one of its faces that does not carry said etching, which etching is perceived by means of the etching carrier medium being transparent (FIG. 1, reference 5).

One of the advantages claimed lies in the fact that, as shown, the bonding face of the metal deposit is not the top of said deposit, thereby preventing any surface defects presented by the top of the metal deposit from being taken into account.

In a variant of the present invention, and by way of technological information, a read-mode interpretation is indicated such as can be performed on the basis of perception that takes account, for example, of value data that results from reflections of the holographic type having characteristics such as induced by the types and the arrangements of the deposited metals.

Another claimed advantage is that, in this way, the etching or the metal deposit is protected by the thickness of the medium carrying the graphic.

In application of the invention, the protection necessary for protecting the top of said deposit or etching, i.e. the face that is not directly bonded to the medium carrying the graphic, is formed (FIG. 2, references 1 and 6) by adding, in exact area superposition, a material that, in accordance with the invention, is preferably of the same composition as the material that received said deposit or etching.

The permanence of the protection of the graphic that, in accordance with the invention, lies at the join plane between two sheets of transparent material, is obtained by various means as described that are included in the present invention.

Thus, in accordance with the invention, said permanence of the protection can be achieved by adhesive bonding over the entire surfaces or at the peripheries only, or by peripheral crimping, implemented by a frame that is, for example, made of a metal presenting characteristics of incorruptibility.

Other claimed means are constituted by sealing by peripheral fusion forming a sealing bead that is reworked mechanically if necessary: abrasion, sealing with a laser or heat nozzle preferably being used, which operation is performed with or without addition of a binder for facilitating the claimed fusion/bonding operation.

In accordance with the present invention, and depending on the type of graphical trace, etching thereof is performed in a manner such that, prior to being turned over for reading or interpreting purposes, in accordance with the invention, the graphic which is, for example, a text, is written in reverse. In this way, the bonded portion of the graphic is interpreted correctly when implementing one of the claimed interpretation or read characteristics. The invention also concerns a mode of easy identification of said medium carrying the graphic that is considered as an element bearing a whole, identification of which should make it quick and easy for it to be picked out if it is to be in contact with other etched carrier media, otherwise a tedious search would be necessary to select the medium whose content it is desired to read or to view. In short marking or other identification is necessary.

With a view to having a uniform format, and with standardization in mind, the term "standardization" being used in a general sense to illustrate one of the characteristics of the invention, there is claimed a solution that is easy to implement, and that is elegant in that, in addition to its primary function, it leads to a reduction in the costs related, in particular, to implementation with a view to reading.

As claimed, the etching carrier medium can be said to be an etched base, the term "etching" being considered in the context of the present invention in a broad sense because said medium is not usually actually etched in the true sense of the word, the term etching being more appropriately used for the deposited material in implementing known techniques of which mention is made. In order to be more precise, for "etching" it should therefore be understood and read "silhouetting" leading to the etching, this being achieved by chemical attack or by collision of the electrons of the material of which the etching carrier medium is made. The characteristic result of the invention leads either to a "negative" trace by absence of metal around the desired represented symbol (text, photograph), or to a "positive" trace.

In any event, the etching carrier medium is intrinsically costly, and it should be noted that a clear financial advantage is procured by the invention in that the extreme miniaturization of the graphic leads to a proportional reduction in the content of said etched surface, for the same etching font.

In accordance with the invention, the resulting useful etched surface area can be of very small size, making it difficult for it to be taken hold of and for the reading or interpretation operations to take place.

One of the inventive claims consists in defining and describing the characteristics of a manipulator for manipulating a graphic carrier medium, and it can be understood that the shape and size of the manipulator should make it simple to use and of low cost, while enabling it to present characteristics that indicate that it has a certain amount of strength. Materials implemented and known by the term "plastic" satisfy these criteria, and a characteristic advantage of the invention is then that any destruction of them by chemicals or by fire does not degrade the graphic carrier module.

The invention is characterized by the possibility of securing said graphic medium by enclosing it after it has been positioned in a device known, in the context of the present invention, as a "manipulator for manipulating graphic media". As a result, various graphic medium formats can be received by the same model of the manipulator. This advantage thus makes it easier to read said graphic, in particular when it is caused to move by means of a device that is known but novel use of which is claimed under the present invention, that device moving said manipulator as described, supported by a servo-controlled device known to the person skilled in the art and enabling the manipulator to move along the X and Y axes of the co-ordinate stage type, facing, for example, an optical system of the lens type used for reading or viewing the graphic. Such a lens can be the lens of a camera for the purpose of reproducing an image, e.g. via a printer.

Another claimed characteristic of the invention is that said manipulator has a zone for receiving indications giving information about the graphic carrier medium and about the content thereof, and markers that are optically interpretable and that can be taken into account by the read system, leading to servo-controlled co-operation as claimed.

Finally, in a variant of the invention, the graphic can also have a marker zone for assisting in making reading easier.

In accordance with the invention, the graphic manipulator is arranged so that it can contain a plurality of graphic carrier media that can thus be removed or added over time.

Said graphic manipulator is then preferably of constant size independently of the content, in a standardized approach, and also carries marker means whose content can be modified, e.g. when data characterizing the graphics is added, which graphics are themselves given marker points that are preferably included while they are being fabricated, and that, in accordance with the invention, in addition to enabling them to be identified, give a marking indication for assisting with reading them, in particular facilitating reading in the event of imperfect silhouetting or of incorrect angular positioning, through interpretation and corresponding action by the X, Y type manipulation equipment as indicated.

The manipulator for manipulating graphics media can be a transparent housing with a lid and with closure means that are reversible for retrieving or adding graphical inscriptions. In addition, the housing can be equipped with sockets or recesses of the indented type and corresponding to the format of the data carrier medium.

It can be understood that, without going beyond the ambit of the invention, the data embodied, in particular when it is digital data, can be transferred onto a graphics carrier medium that can be caused to move in rotation for the purposes of reading it, on the basis of the principles used, for example, in the compact disc field. In accordance with the invention, the modes of protecting the etching and of constituting the etching are characteristic of the invention. It can be understood that the graphical data must be arranged by taking into consideration the read mode, namely X, Y or rotation. Applications claimed in accordance with the present invention considered as a whole, also include: a storage and durable preservation device containing the miniaturized exact reproduction of graphical data, e.g. a text, or a photograph; and a device for storing data that can then be interpreted in the form of sound production as good as that of a compact disc.

Finally, the invention also relates to a marking device imparting traceability to an article carrying the said graphical assembly placed by adhesive bonding or by any other means such as overmolding.

The invention claimed is:

1. A method of making a data carrier medium, said medium being arranged to allow for durably preserving said data and viewing said data through the medium, said method comprising the steps of:

providing a data carrier medium comprising a first transparent carrier layer made of sapphire arranged for carrying a graphical inscription on said first carrier layer, the graphical inscription being a miniaturized exact reproduction of said data so that the graphical inscription can be interpreted by the human eye after magnification, performing the graphical inscription by depositing on the first face of the first carrier layer at least one lithographic deposition of metal having an optical opacity, the graphical inscription being performed by partial superposition of metal deposits on the first carrier layer, the graphical inscription further being performed in reverse relative to the direction in which the inscription is read, placing a second transparent carrier layer of data carrier medium made of sapphire in superposition on the first face of the first carrier layer so as to protect the graphical inscription, enclosing said first and second carrier layers in a transparent housing with two opposite transparent sides arranged in such a way that the optical opacity of the graphical inscription is directly interpretable by the human eye after magnification when the first face of the first carrier layer is illuminated through one of said transparent sides of said housing and the second carrier layer and the graphical inscription is viewed through a second face of the first carrier layer and the other transparent side of said housing.

2. A method according to claim 1, in which a succession of depressions and of projections representing binary data are formed while the layers of metal deposits are being partially superimposed.

3. A method according to claim 1, in which the graphical inscription is formed by a set of points distributed with variable density so as to represent relief.

4. A method according to claim 1, in which the first carrier layer is sealed to the second carrier layer in fluid-tight manner by using a laser fusion method at their peripheries.

5. A method according to claim 1, in which the first carrier layer is sealed to the second carrier by crimping at their peripheries in a frame.

6. A method according to claim 1, further comprising the step of providing said housing with a lid and with a reversible closure for making it possible to retrieve or to add graphical inscriptions.

7. A method according to claim 6, in which the housing is equipped with indent sockets or depressions corresponding to the format of the data carrier medium.

8. A method according to claim 6, comprising the step of securing the data carrier medium in the housing.

9. A method according to claim 6, comprising the step of providing a device for said optical reading which is equipped with a device for moving said housing along X and Y axes and/or for moving said housing in rotation for the purpose of reading the graphical inscription.

10. A method according to claim 9, comprising the step of providing a device for said optical reading which is equipped with a servo-control system and with optical markers for servo-controlling said device for moving said housing.

* * * * *